United States Patent [19]
Yamamoto et al.

[11] Patent Number: 5,440,511
[45] Date of Patent: Aug. 8, 1995

[54] SEMICONDUCTOR MEMORY DEVICE

[75] Inventors: Hiroshi Yamamoto; Kiyonori Ogura; Takashi Horii, all of Kasugai, Japan

[73] Assignee: Fujitsu Limited, Kanagawa, Japan

[21] Appl. No.: 210,385

[22] Filed: Mar. 18, 1994

[30] Foreign Application Priority Data

Jun. 15, 1993 [JP] Japan .................. 5-144001

[51] Int. Cl.[6] ............................. G11C 7/00
[52] U.S. Cl. ........................... 365/189.05; 365/233; 365/233.5
[58] Field of Search .................. 365/189.05, 206, 233, 365/233.5, 191, 194; 307/480

[56] References Cited

U.S. PATENT DOCUMENTS

| | | | |
|---|---|---|---|
| 4,661,928 | 4/1987 | Yasuoka | 365/206 |
| 4,965,474 | 10/1990 | Childers et al. | 365/206 |
| 4,970,693 | 11/1990 | Nozaki et al. | 365/233 |
| 5,323,359 | 6/1994 | Kayamoto et al. | 365/206 |

Primary Examiner—Joseph A. Popek
Assistant Examiner—Vu Le
Attorney, Agent, or Firm—Armstrong, Westerman, Hattori, McLeland & Naughton

[57] ABSTRACT

A semiconductor memory device has a first control signal is externally input to an input buffer circuit. A second control signal output from the input buffer circuit is input to an internal circuit. The internal circuit comprises a memory cell array having a number of memory cells and peripheral circuits for writing and reading cell information in and from the memory cells, and the writing and reading operations are executed based on the second control signal. Read data output from the internal circuit is input to an output buffer, which outputs the read data as output data. Power from a common power supply is supplied to the input buffer circuit and the output buffer. A noise-remove signal generator, which is connected to the input buffer circuit, functions based on either one of the first control signal and the second control signal to generate a noise remove signal in synchronism with an output timing of the output data. A noise removing circuit removes noise from the second control signal based on the noise remove signal.

6 Claims, 10 Drawing Sheets

SEMICONDUCTOR MEMORY DEVICE

BACKGROUND OF THE INVENTION

Field of the Invention

The present invention relates to a Dynamic Random Access (DRAM) semiconductor memory device which incorporates noise reduction circuit.

Description of the Related Art

With the advent of 16 and 32 bit parallel processors, commonly available today, there is an increasing demand on manufacturers of semiconductor memory circuits to design and build memory circuits able to sequence data at faster and faster rates. Generally, memories circuits used in commercial microcomputers include Read Only Memory (ROM), which is nonvolatile or permanent type of memory, as well as Random Access Memory (RAM), which is volatile or temporary type of memory. The latter is commonly constructed either as Static memory (SRAM) or Dynamic memory (DRAM). SRAM stores bits of data in an array of flip flops whereas DRAM stores data bits as charged capaciters. A bit once written in a SRAM usually stays in the memory until it is rewritten or until the power is turned off. In a DRAM, data will disappear in a very short time unless it is "refreshed" by periodic clocking through "rows" of a two dimensional pattern of bits in a memory chip.

For example, given a 20 bit address for a 1 Megabyte DRAM, the address would be split into two groups and multiplexed onto half the number of pins: first, the "row address" signaled by a "row address strobe (/RAS), and second, the "column address" signaled by a column address strobe (/CAS). Data is normally read or written following the assertion of the /CAS. A significant challenge is trying to keep all the bused strobes and address lines noise-free. This problem typically presents itself in part as a rail to rail transient current produced by the memory chip itself.

FIG. 1 illustrates the general structure of a conventional DRAM. Control signals /RAS (row address strobe signal) and /CAS (column address strobe signal), which control the operation of this DRAM, are output as control signals RASX and CASX to an internal circuit via an input buffer 2. The control signal RASX is input to an address buffer 4 as a signal to latch a row address, while the control signal CASX is input to the address buffer 4 as a signal to latch a column address. The control signal RASX is also input to an input/output (I/O) buffer 9 as an activate or enable signal, while the control signal CASX is likewise input to this I/O buffer 9 as an input/output control signal. Further the control signal RASX is input to a write clock generator 10 as an activate or enable signal. The control signal CASX is likewise input to this write clock generator 10 as a signal to latch a write enable signal /WE which is input to this write clock generator 10.

Address signals A0 to A9 input to the address buffer 4 are latched in the address buffer 4 based on the control signals RASX and CASX, and are output therefrom to a row decoder 5 and a column decoder 6. The row decoder 5 and column decoder 6 select specific memory cells in a memory cell array 7 based on the address signals A0 to A9. At the time of reading cell information, the cell information read from the selected memory cells are output as output data Dout via a sense amplifier and I/O gate 8 and the I/O buffer 9. At the time of writing cell information, write data Din, which is input to the I/O buffer 9, is written in the selected memory cells via the sense amplifier and I/O gate 8 and the I/O buffer 9. The I/O buffer 9 is controlled based on the write enable signal /WE, input via the write clock generator 10 to the I/O buffer 9, and an output control signal /OE and the control signals RASX and CASX, which are input to the I/O buffer 9. The input buffer 2, the I/O buffer 9 and the other circuits operate based on power from a common power supply Vcc.

The input buffer 2 will now be described with reference to FIG. 2. The control signal /CAS is input to a CMOS inverter 1a that ouputs an output signal CAS, which is the control signal /CAS inverted, to a CMOS inverter 1b. The CMOS inverter 1b outputs a control signal CASX, which is the input signal CAS inverted, to an internal circuit. The control signal /RAS is likewise output as a control signal RASX via two stages of inverters.

When the control signal /CAS, which falls to an L level from an H level as shown in FIG. 3, for example, is input to the input buffer 2, the control signal CASX which is output from the input buffer 2 falls to an L level from an H level. A reading operation starts based on the control signal CASX input to an internal circuit and cell information read at the timing of the falling of the control signal CASX is output as an output signal Dout.

In a DRAM, when multi-bit output signals Dout rise to an H level from an L level and are output simultaneously, the voltage level of a high-potential power supply Vcc temporarily drops, generating noise N1. Consequently, noise N2 appears on the output signal CAS of the CMOS inverter 1a constituting the input buffer 2, generating noise N3 on the control signal CASX which is output from the CMOS inverter 1b. As a result, the address that is latched at the timing of the falling of the control signal CASX may be changed to another address by the noise N3 generated by this control signal CASX, so that erroneous data would be output.

SUMMARY OF THE INVENTION

It is therefore an object of the present invention to provide a semiconductor memory device, which is designed to prevent malfunction from occurring due to power supply noise that is generated in accordance with a data outputting operation.

To achieve this object, a semiconductor memory device embodying this invention is designed as follows. A first control signal is externally input to an input buffer circuit. A second control signal output from the input buffer circuit is input to an internal circuit. The internal circuit comprises a memory cell array having a number of memory cells and peripheral circuits for writing and reading cell information to and from the memory cells based on the second control signal. Read data, output from the internal circuit, is input to an output buffer circuit which outputs the read data as output data. Power from a common power supply is supplied to the input buffer circuit and the output buffer circuit. A noise-suppressing signal generator, which is connected to the input buffer circuit, functions based on either one of the first control signal and the second control signal to generate a noise suppressing signal in synchronism with an output timing of the output data. A noise suppressing circuit removes noise from the second control signal based on the noise suppressing signal.

BRIEF DESCRIPTION OF THE DRAWINGS

The features of the present invention that are believed to be novel are set forth with particularily in the appended claims. The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
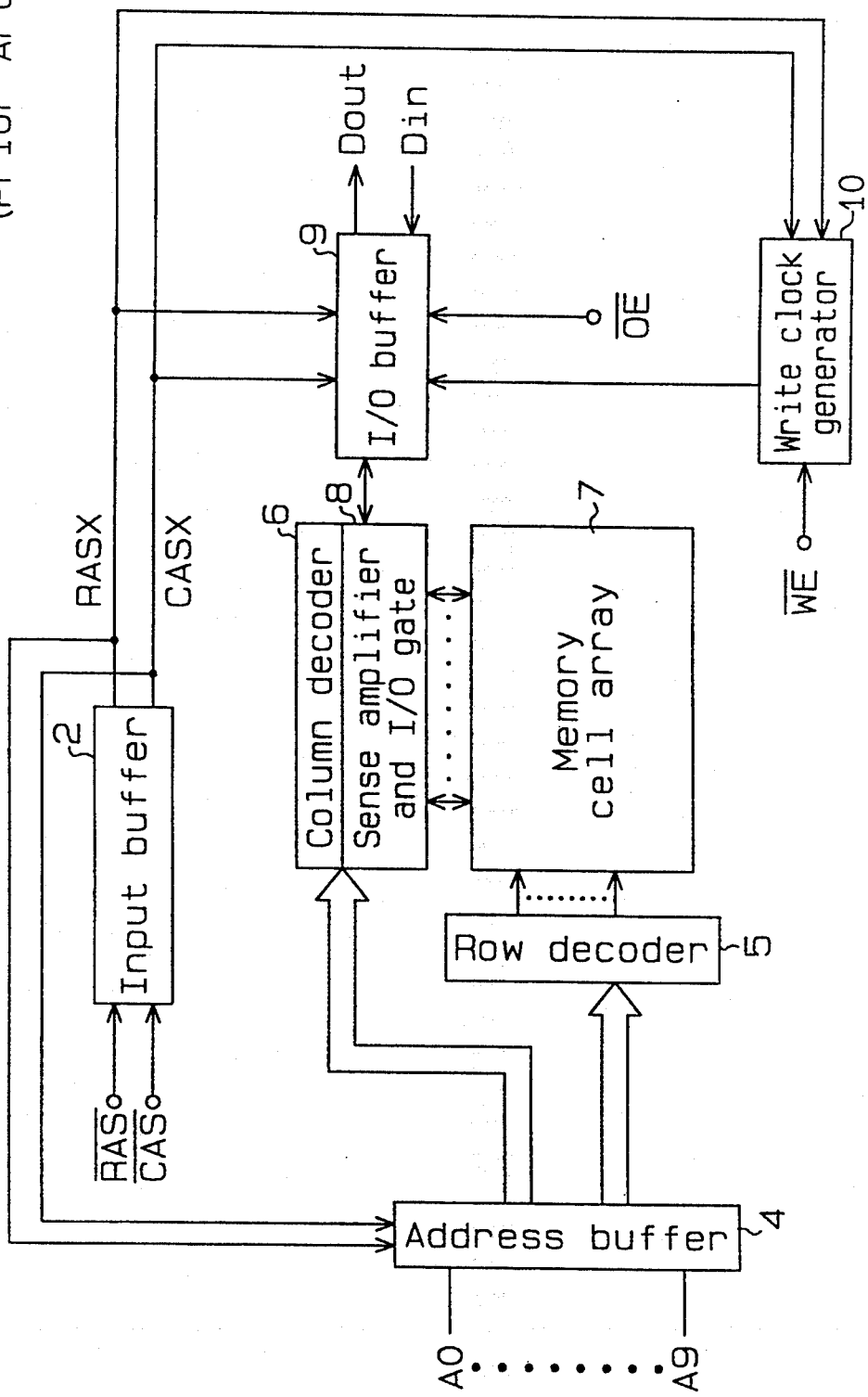
FIG. 1 is a block diagram illustrating a conventional semiconductor memory device.
Figure 2:
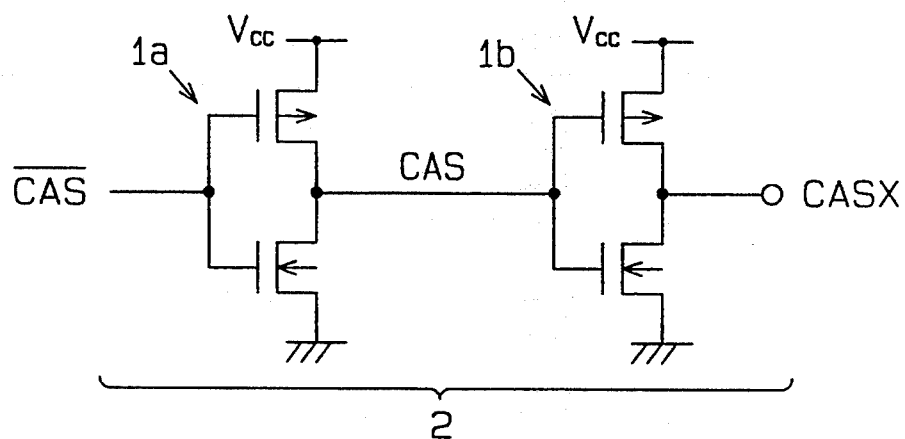
FIG. 2 is a circuit diagram showing a conventional input buffer circuit.
Figure 3:
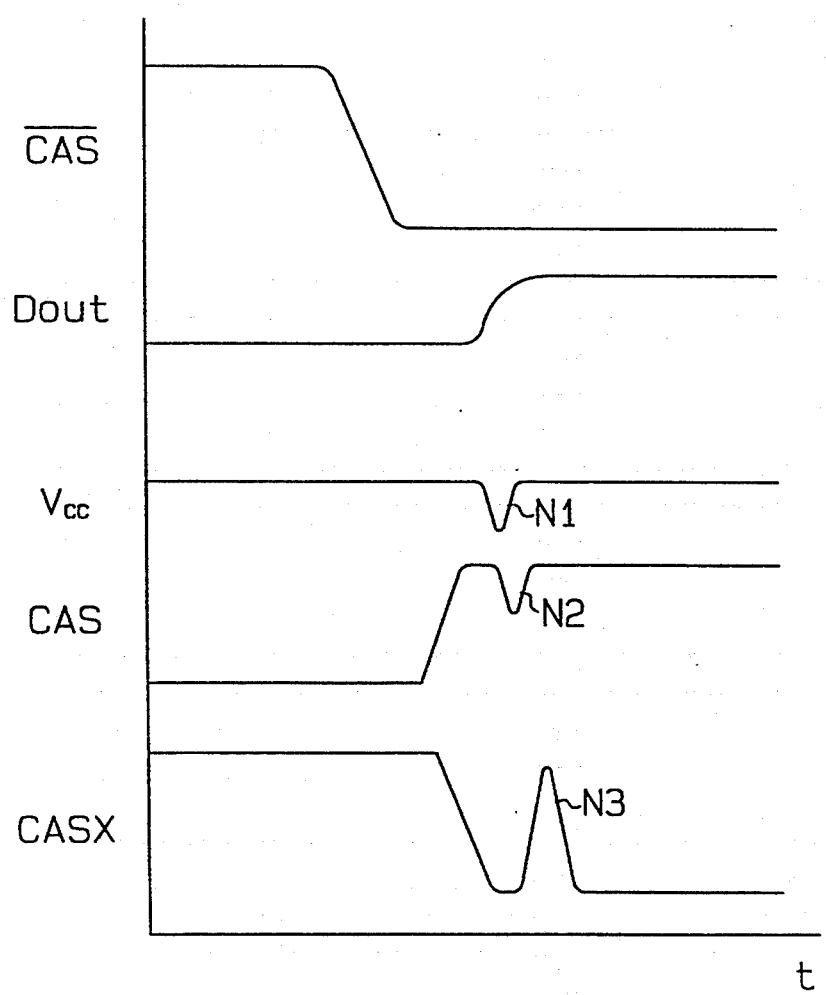
FIG. 3 is a waveform diagram illustrating the operation of the input buffer circuit shown in FIG. 2.
Figure 4:
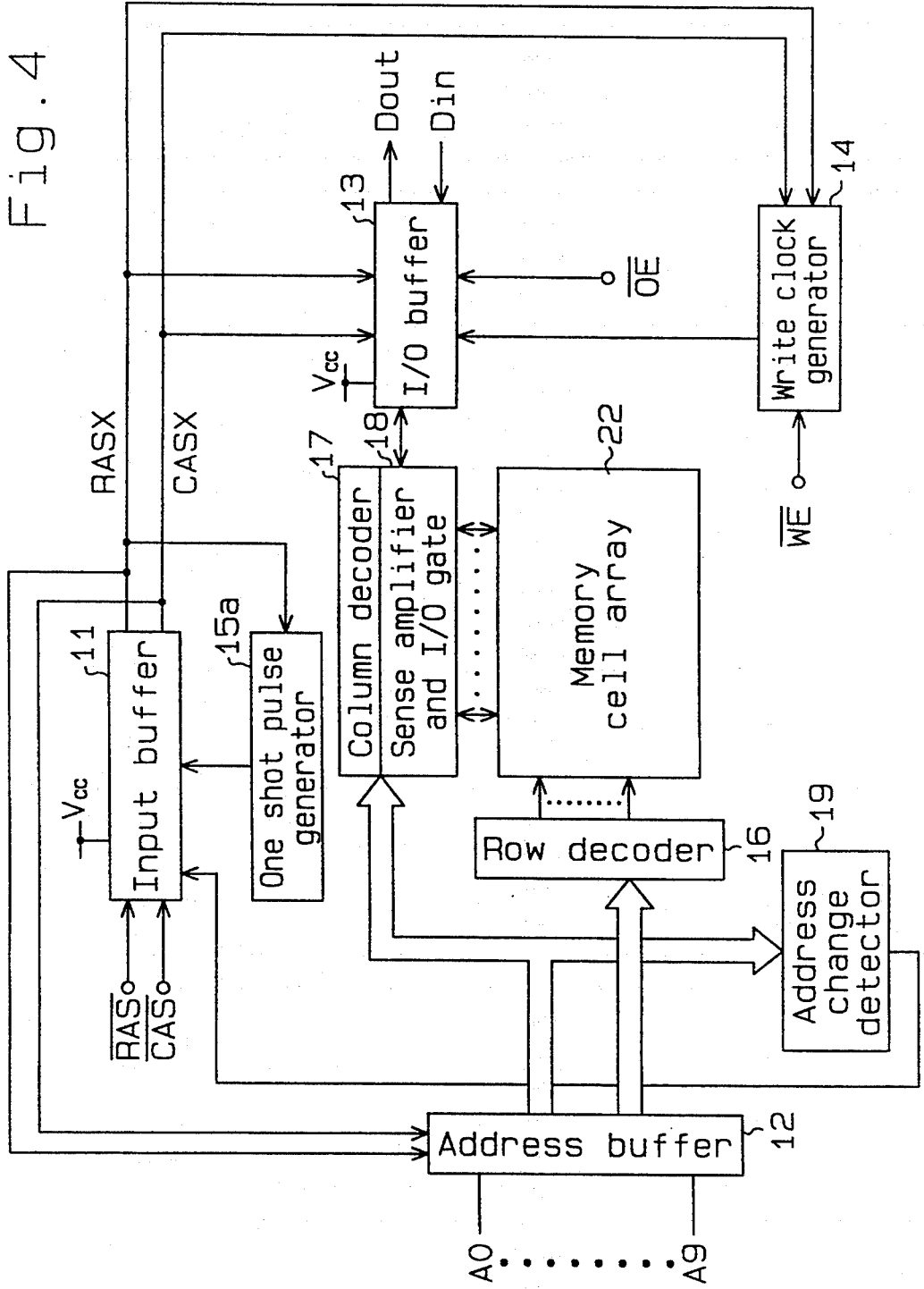
FIG. 4 is a block diagram of a semiconductor memory device according to the present invention.

FIG. 4 illustrates the general structure of a DRAM according to a first embodiment of the present invention. Control signals /RAS and /CAS, which control the operation of this DRAM, are output as control signals RASX and CASX to an internal circuit via an input buffer circuit 11. The control signal RASX is input to an address buffer 12 as a signal to latch a row address, while the control signal CASX is input to the address buffer 12 as a signal to latch a column address. The control signal RASX is also input to an input/output (I/O) buffer circuit 13 as an activate or enable signal, while the control signal CASX is likewise input to this I/O buffer circuit 13 as an input/output control signal. Further, the control signal RASX is input to a write clock generator 14 as an activate or enable signal. The control signal CASX is likewise input to this write clock generator 14 as a signal to permit the write clock generator 14 to latch a write enable signal /WE which is input to this clock generator 14.

The control signal RASX is input to a one shot pulse generator 15a whose output signal is input to the aforementioned input buffer circuit 11. Address signals A0 to A9 are input to a row decoder 16 and a column decoder 17 via the address buffer 12. The row decoder 16 and column decoder 17 select specific memory cells in a memory cell array 22 based on the address signals A0 to A9. At the time of reading cell information, the cell information read from the selected memory cells are output as output data Dout via a sense amplifier and I/O gate 18 and the I/O buffer circuit 13. At the time of writing cell information, write data Din, which is input to the I/O buffer circuit 13, is written in the selected memory cells via the sense amplifier and I/O gate 18 and the I/O buffer circuit 13. The I/O buffer circuit 13 is controlled based on the write enable signal /WE, input via the write clock generator 14 to the I/O buffer circuit 13, and an output control signal /OE and the control signals RASX and CASX, which are input to the I/O buffer circuit 13. The address signals A0 to A9 output from the address buffer 12 are input to an address change detector 19. The address change detector 19 detects a change in any of the address signals A0 to A9 and outputs an output signal to the input buffer circuit 11.

Figure 5:
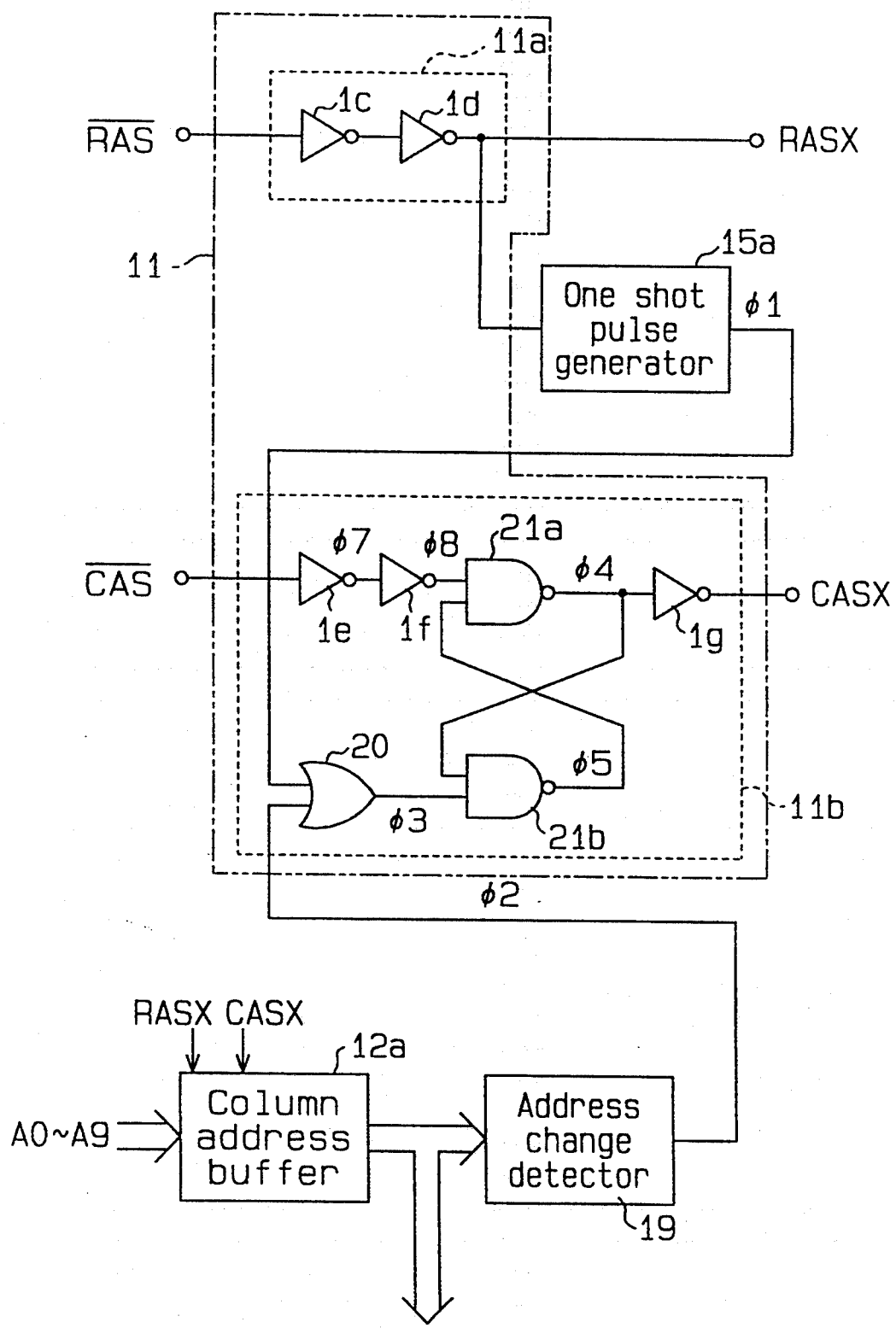
FIG. 5 is a circuit diagram showing an input buffer circuit according to a first embodiment of this invention.

A specific structure of the input buffer circuit 11 will now be described referring to FIG. 5. The input buffer circuit 11 has a first input buffer circuit 11a and a second input buffer circuit 11b. The first input buffer circuit 11a has two stages of inverters, 1c and 1d, connected in series, with the control signal /RAS input to the inverter 1c. The output signal of the inverter 1d is output as the control signal RASX to the internal circuit. The control signal RASX is input to the aforementioned one shot pulse generator 15a. The one shot pulse generator 15a supplies an output signal $\phi 1$ to a first input terminal of an OR gate 20 in the second input buffer circuit 11b.

The control signal /CAS is input to an inverter 1e of the second input buffer circuit 11b. The output signal, $\phi 7$, of the inverter 1e is input to an inverter 1f whose output signal $\phi 8$ is input to a first input terminal of a NAND gate 21a. Accordingly, the inverters 1e and 1f function as an input buffer circuit. The output signal, $\phi 2$, of the address change detector 19 is input to a second input terminal of the OR gate 20. The address change detector 19 receives a column address strobe signal from a column address buffer 12a constituting the address buffer 12. The control signals RASX and CASX are input to the column address buffer 12a. The column address buffer 12a receives the input column address signals A0 to A9 when the control signal RASX goes low, and latches and outputs the received column address signals A0 to A9 when the control signal CASX goes low.

The output signal, $\phi 3$, of the OR gate 20 is input to a first input terminal of a NAND gate 21b whose second input terminal is supplied with the output signal, $\phi 4$, of the NAND gate 21a. The output signal, $\phi 5$, of the NAND gate 21b is input to a second input terminal of the NAND gate 21a. The output signal $\phi 4$ of the NAND gate 21a is input to an inverter 1g whose output signal is input as the control signal CASX to the internal circuit. The OR gate 20 and the NAND gates 21a and 21b function as a noise suppressing circuit for suppressing noise from the output signal, $\phi 8$, of the inverter 1f.

Figure 6:
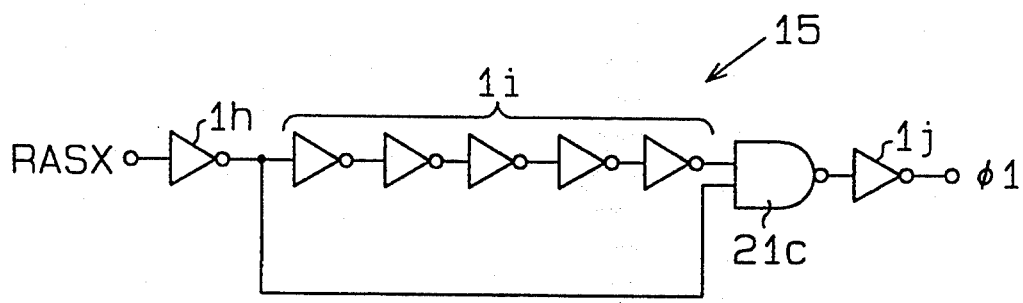
FIG. 6 is a circuit diagram showing a one shot pulse generator shown in FIG. 5.

A specific structure of the one shot pulse generator 15a will be described below with reference to FIG. 6. The control signal RASX is input to an inverter 1h. The output signal of the inverter 1h is input directly to a first input terminal of a NAND gate 21c, and is also input to a second input terminal of the NAND gate 21c via odd-numbered stages of inverters 1i. The output signal of the NAND gate 21c is input to an inverter 1j which outputs the aforementioned output signal $\phi 1$. Using the aforementioned one shot pulse generator 15a, when the control signal RASX falls low, a one shot pulse signal with a pulse width based on the operational delay time of inverters 1*i*, is output as the output signal φ1. The timing of the H-level output signal φ1 following the fall of the control signal RASX, is set equal or coincident with the timing at which the aforementioned output data Dout is output following the fall of the control signal /RAS. The one shot pulse generator 15*a* having the described structure functions as a noise-suppressing signal generator.

Figure 7:
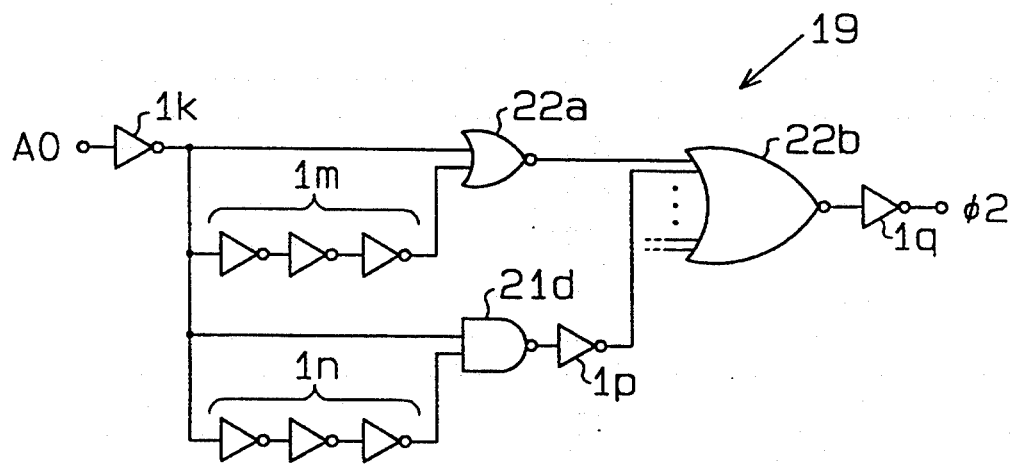
FIG. 7 is a circuit diagram showing an address change detector shown in FIG. 5.

A specific structure of the address change detector 19 will now be described below with reference to FIG. 7. The address signal A0 is input to an inverter 1*k*. The output signal of the inverter 1*k* is directly input to a first input terminal of a NOR gate 22*a* and to a second input terminal of the NOR gate 22*a* via three stages of inverters 1*m*. The output signal of the inverter 1*k* is also input to a first input terminal of a NAND gate 21*d* directly and to a second input terminal of the NAND gate 21*d* via three stages of inverters 1*n*. The output signal of the NOR gate 22*a* is input directly to a NOR gate 22*b*, and the output signal of the NAND gate 21*d* is input via an inverter 1*p* to the NOR gate 22*b*. The other address signals A1 to A9 are likewise input to circuits which are similar to the inverters 1*k* to 1*p*, the NOR gate 22*a* and the NAND gate 21*d*. The output signals of those circuits are also input to the NOR gate 22*b*. The output signal of the NOR gate 22*b* is input to an inverter 1*q* which in turn outputs the aforementioned output signal φ2.

Figure 8:
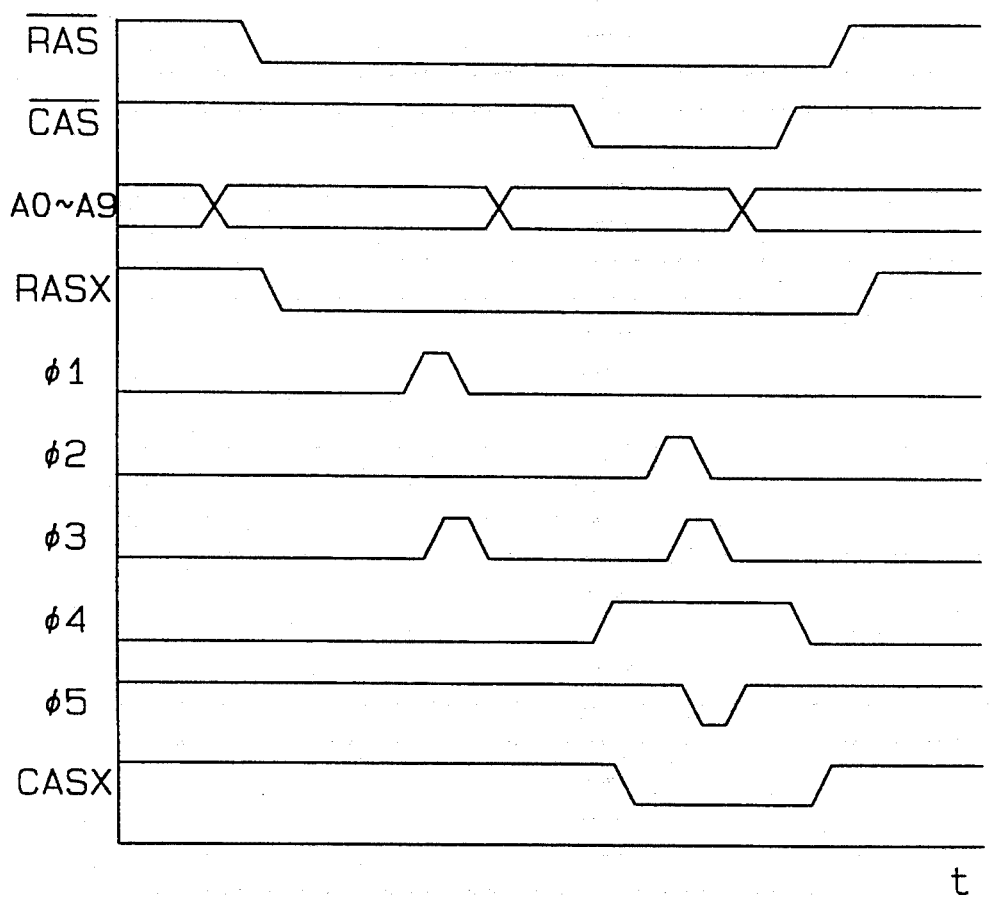
FIG. 8 is a waveform diagram illustrating the operation of the input buffer circuit shown in FIG. 5.

In the change detector 19 as described, when the address signal A0, for example, falls low, an high level pulse signal with a pulse width based on the operation delay time of the inverters 1*n* is input to the NOR gate 22*b* from the inverter 1*p*. When the address signal A0 goes high, an high level pulse signal with a pulse width based on the operation delay time of the inverters 1*m* is input to the NOR gate 22*b* from the NOR gate 22*a*. When at least one of the address signals A0 to A9 changes from an H level to an L level or vice versa, an H-level pulse signal is output as the output signal φ2 from the address change detector 19. The timing at which the H-level output signal φ2 is output from the address change detector 19, based on a level change in the address signals A0 to A9, is set equal to the timing at which the output data Dout is output after the level change in the address signals A0–A9. The address change detector 19 with the above-described structure functions as the noise-suppressing signal generator. The operation of the input buffer circuit 11 with the above-described structure will be explained with reference to FIG. 8. When the control signal /RAS falls to an L level from an H level, the control signal RASX, which is output from the first input buffer circuit 11*a* falls to an L level from an H level. When this falling of the control signal RASX occurs, the one shot pulse generator 15*a* outputs the H-level pulse signal φ1. When a level change occurs in any one of the address signals A0 to A9, the address change detector 19 outputs the H-level pulse signal φ2. Consequently, the output signal φ3 of the OR gate 20 becomes an H level based on the received pulse signals φ1 and φ2. When the control signal /CAS goes low, the output signal φ4 of the NAND gate 21*a* goes high, causing the output signal CASX of the inverter 1*g* to go low. When the output signal φ3 of the OR gate 20 goes high at this time, the output signal φ5 of the NAND gate 21*b* goes low.

Figure 9:
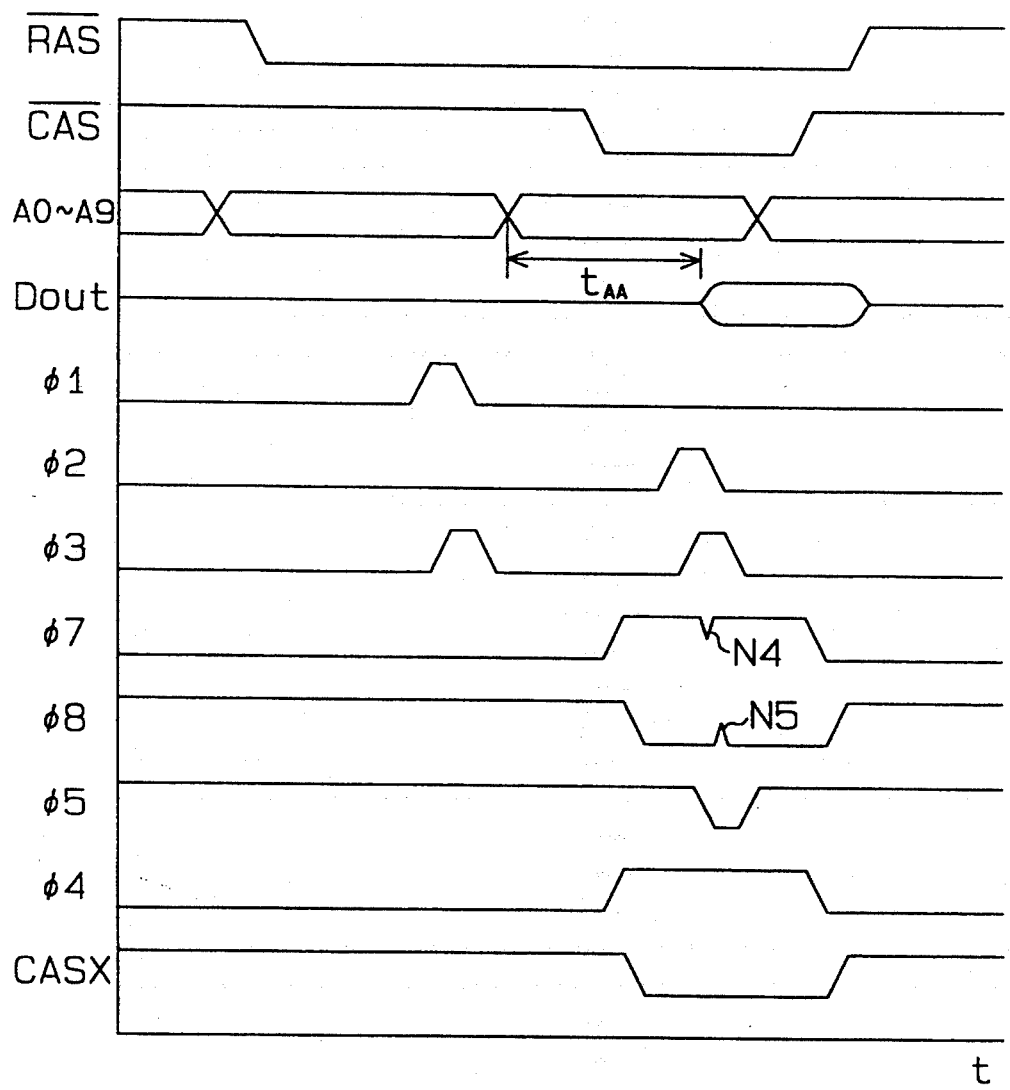
FIG. 9 is a waveform diagram illustrating the operation of the input buffer circuit shown in FIG. 5.

Referring to FIG. 9, a description will now be given of the operation of the DRAM equipped with the input buffer circuit 11 which function in the above-described manner. In the illustrated reading operation, the output data Dout is output when a time $t_{aa}$ elapses after a level change has occurred in any of the address signals A0–A9. When the output data Dout are output simultaneously, noise is generated in the power supply and noises N4 and N5 respectively appear on the output signals φ7 and φ8 of the inverters 1*e* and 1*f*. Signal φ5 of the NAND gate 21*b* is at an L level based on the output signal φ2 of the address change detector 19. Upon generation of the noises N4 and N5, the output signal of the NAND gate 21*a* is fixed to an H level, inhibiting the generation of any noise. Therefore, no noise will appear on the control signal CASX which is output to the internal circuit from the inverter 1*g*. This inhibits an undesirable or unintended level change in the address signals A0–A9 which are latched by the column address buffer 12*a*, consequently preventing erroneous data from being read out.

Figure 10:
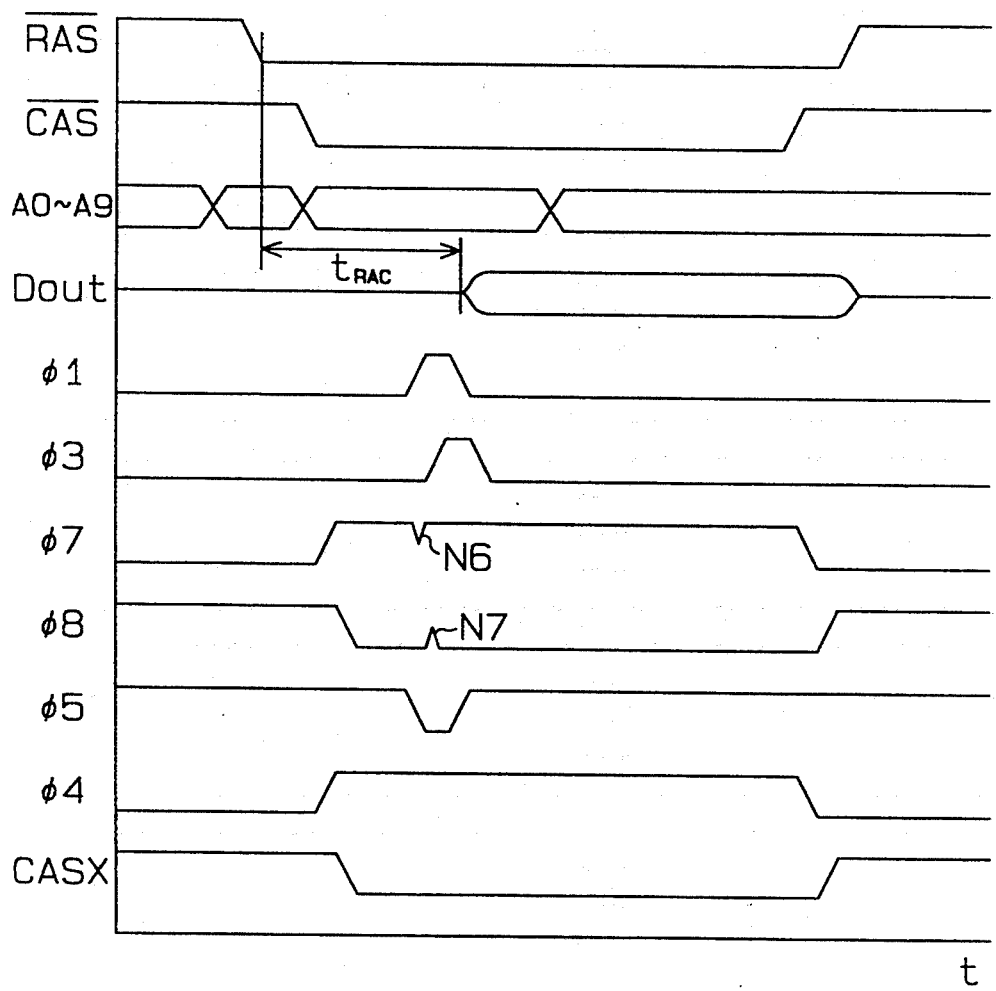
FIG. 10 is a waveform diagram illustrating the operation of the input buffer circuit shown in FIG. 5.

In a reading operation exemplified in FIG. 10, the output data Dout is output when a time $t_{RAC}$ elapses after the falling of the control signal /RAS. When the output data Dout are output simultaneously, noise is generated in the power supply and noises N6 and N7 appear on the output signals φ7 and φ8 of the inverters 1*e* and 1*f* respectively. The output signal φ5 of the NAND gate 21*b* is held low based on the output signal φ1 of the one shot pulse generator 15*a*. Upon generation of the noises N6 and N7, no noise will appear on the output signal φ4 of the NAND gate 21*a*. Consequently, no noise will appear on the control signal CASX which is output to the internal circuit from the inverter 1*g*. This inhibits any undesirable or unintended level change in the address signals A0–A9, latched by the column address buffer 12*a*, and further prevents erroneous data from being read out.

Figure 11:
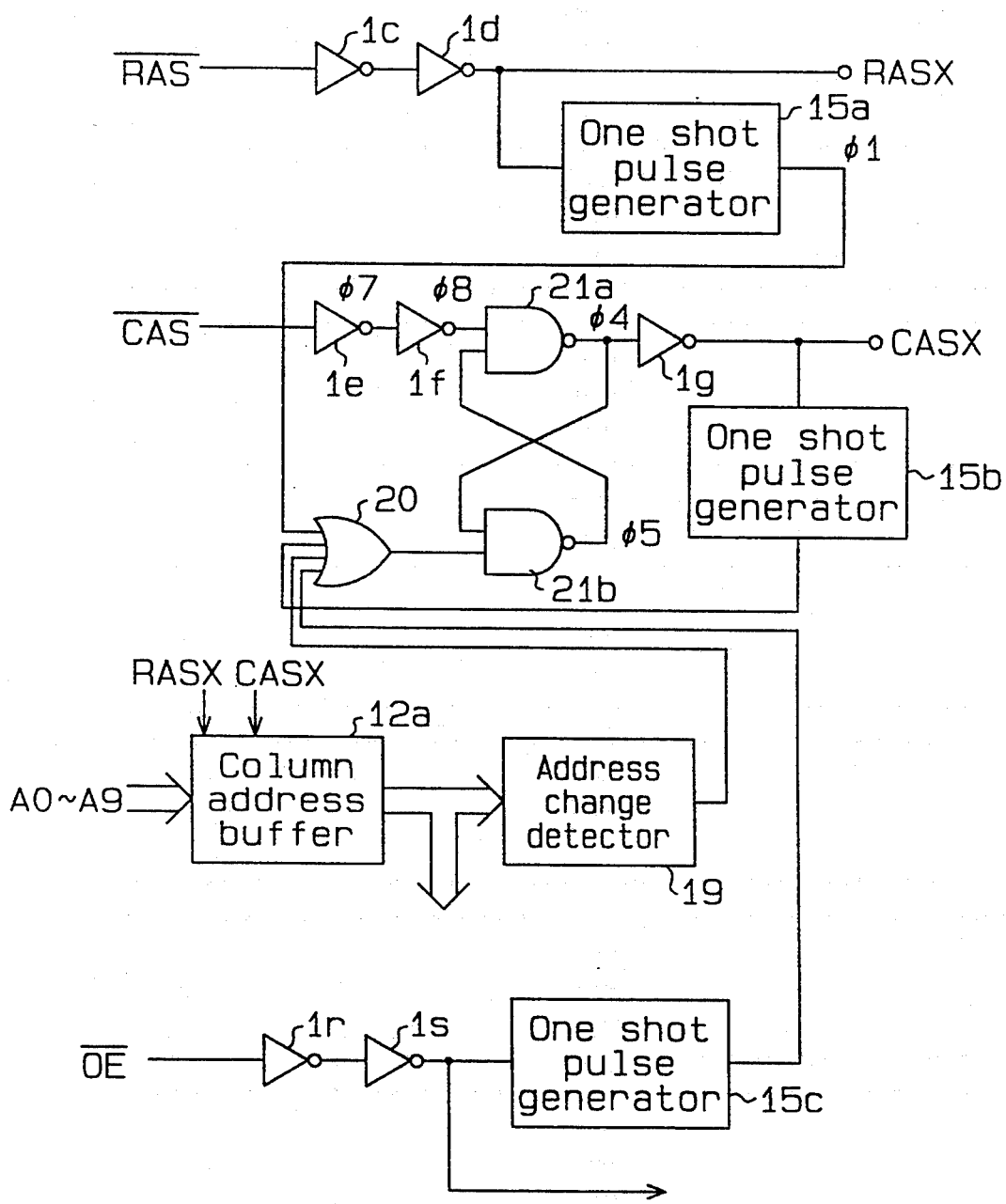
FIG. 11 is a circuit diagram showing an input buffer circuit according to a second embodiment of this invention.

FIG. 11 illustrates a second embodiment of the present invention. This embodiment provides an additional structure for suppressing noise from the control signal CASX based on the control signal CASX or an output control signal /OE. The control signal CASX is input to a one shot pulse generator 15*b* whose output signal is input to the OR gate 20. The output control signal /OE is input to a one shot pulse generator 15*c* via inverters 1*r* and 1*s*, which function as an input buffer circuit. The output signal of the one shot pulse generator 15*c* is input to the OR gate 20. The timing at which a one shot pulse is output from the one shot pulse generator 15*c* is set to match the timing of output data signal Dout. With this structure, it is possible to suppress the noise which occurs on the control signal CASX when the output signal Dout is output, based on the control signal CASX or the output control signal /OE. The one shot pulse generators 15*b* and 15*c* therefore in part function as a noise-suppressing signal generator.

Figure 12:
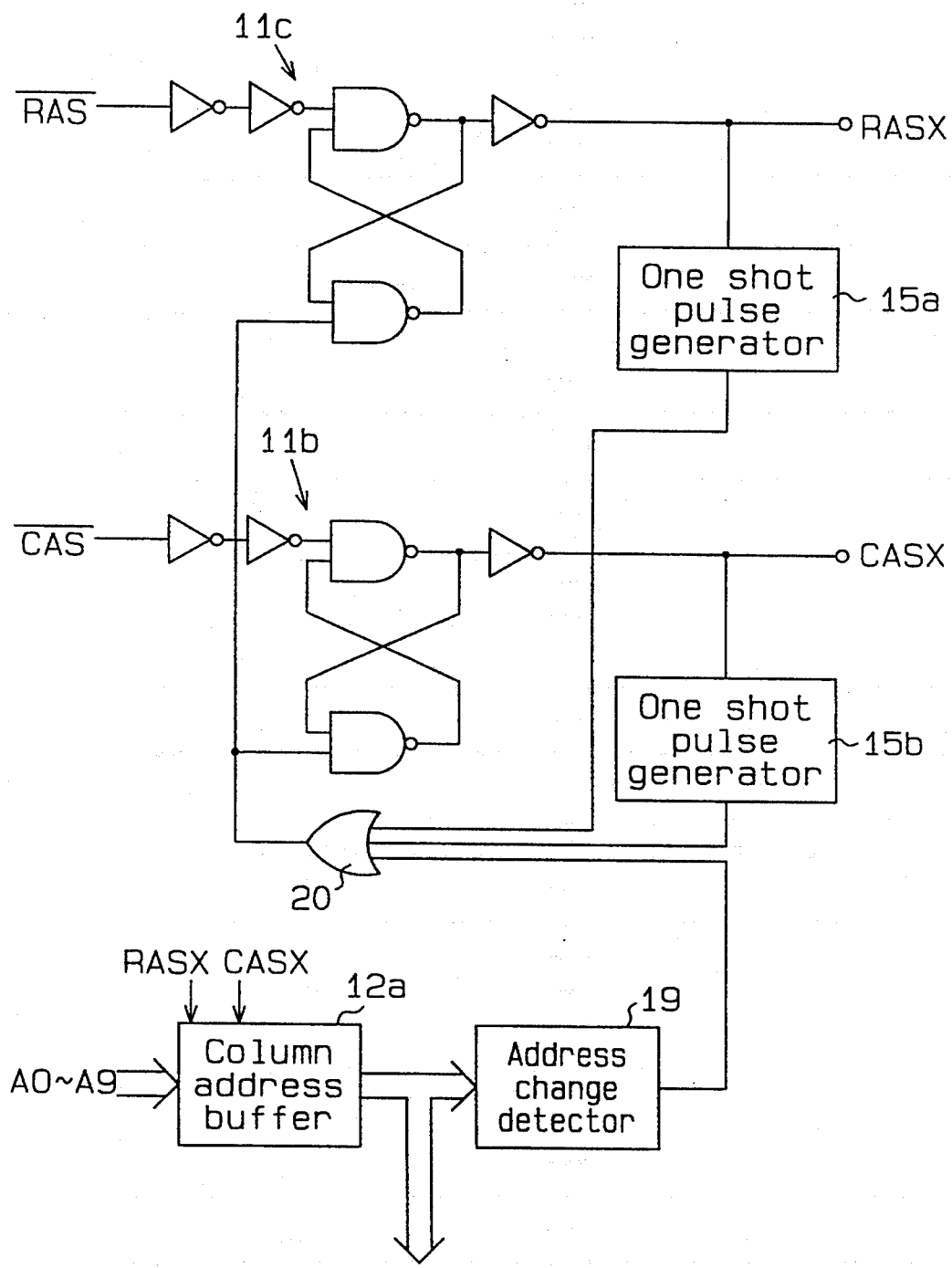
FIG. 12 is a circuit diagram showing an input buffer circuit according to a third embodiment of this invention.

FIG. 12 illustrates a third embodiment of the present invention. This embodiment is designed to suppress noise from the control signal CASX and the control signal RASX. The control signal /RAS is input to a third input buffer circuit 11*c* having a structure similar to that of the second input buffer circuit 11*b*. The control signal RASX output from the third input buffer circuit 11*c* is input to the one shot pulse generator 15*a* as well as to the internal circuit. The output signal of the one shot pulse generator 15*a* is input to the OR gate 20 whose output signal is input to the second and third input buffer circuits 11*b* and 11*c*. This structure will suppress the noise which occurs on the control signal RASX when the output data Dout is output.

What is claimed is:

1. A semiconductor memory device responsive to at least one input control signal and to a plurality of memory location address signals for outputting data when supplied with power from a power supply, wherein noise created by the outputting of said data is suppressed, said semiconductor memory device comprising:
   a semiconductor memory;
   a control buffering means for buffering the input of said input control signal in order to produce said at least one output control signal;
   a data buffering means for buffering data input and output respectively to and from said semiconductor memory, said data buffering means producing output data;
   said semiconductor memory being responsive to said control buffering means and to said data buffering means, for storing said data written thereto and read therefrom;
   a signal generating means responsive to one of said at least one input signal and said at least one output control signal, for generating a noise suppressing signal in synchronism with said output data from said data buffering means; and
   suppressing means responsive to said noise suppressing signal and to said input control signal, for suppressing said noise; wherein said control buffering means further comprises a digital logic circuit responsive to said input control signal and to said noise suppressing signal for generating an output signal on which said noise is suppressed.

2. The semiconductor memory device according to claim 1, further comprising means for buffering said memory location address signals provided as input to said semiconductor memory to form buffered memory location address signals, and wherein said signal generating means further comprises means for detecting occurrence of a change in the buffered memory location address signals.

3. The semiconductor memory device according to claim 1, wherein said input control signal comprises a row address strobe signal and a column strobe signal, and wherein said signal generating means comprises a one shot pulse generator, responsive to a single signal output from said control buffering means.

4. A semiconductor memory device responsive to at least one input control signal and to a plurality of memory location address signals for outputting data when supplied with power from a power supply, wherein noise created by the powering of said semiconductor memory device and by the outputting of said data, is suppressed, said semiconductor memory device comprising:
   a semiconductor memory;
   a control buffering means for buffering the input of a row address strobe signal and a column address strobe signal and for outputting said at least one output control signal;
   a data buffering means for buffering data input and output respectively to and from said semiconductor memory, said data buffering means producing output data;
   said semiconductor memory being responsive to said control buffering means and to said data buffering means, for storing said data written thereto and read therefrom;
   a signal generating means for buffering the input of said memory location address signals provided to said semiconductor memory, said signal generating means further comprising means for detecting occurrence of a change in the buffered memory location address signals; and
   a digital logic means for suppressing noise produced on said column address strobe signal output from said buffering means, said logic means being responsive to said column address strobe control signal input to said control buffering means and to said noise suppressing signal.

5. A semiconductor memory device responsive to at least one input control signal and a plurality of memory location address signals for outputting data when supplied with power from a power supply, wherein noise created by the powering of said semiconductor memory device and by the outputting of said data, is suppressed, said semiconductor memory device comprising:
   a semiconductor memory;
   a control buffering means for buffering input of a row address strobe signal and a column address strobe signal in order to output a row address strobe control signal and a column address strobe control signal;
   a data buffering means for buffering data input and output respectively to and from said semiconductor memory, said data buffering means producing output data;
   a column address buffering means for buffering input of said memory location address signals to said semiconductor memory device;
   memory means responsive to said control buffering means and to said data buffering means, for storing said data written to and read from said semiconductor memory;
   a first signal generating means responsive to said row address strobe control signal output from said control buffering means, for generating a one shot pulse signal in synchronism with output of data from said data buffering means and for outputting a noise suppressing signal therefrom;
   a second signal generating means coupled to said column address buffering means for detecting a change in said memory location address signals, and for generating an address change detector signal; and
   a digital logic means for suppressing noise produced on said column address strobe signal output from said buffering means, said digital logic means being responsive to said column address strobe signal input to said control buffering means, to said noise suppressing signal, and to said address change detector signal.

6. A semiconductor memory device responsive to at least one input control signal and a plurality of memory location address signals for outputting data when supplied with power from a power supply, wherein noise created by the powering of said semiconductor memory device and by the outputting of said data, is suppressed, said semiconductor memory device comprising:
   a semiconductor memory;
   a control buffering means for buffering input of a row address strobe signal and a column address strobe signal in order to output a row address strobe control signal and a column address strobe control signal;

a data buffering means for buffering data input and output respectively to and from said semiconductor memory, said data buffering means producing output data;

a column address buffering means for buffering input of said memory location address signals to said semiconductor memory device;

means for detecting a change in said memory location address signals and for outputting an address change detection signal therefrom;

memory means responsive to said control buffering means and to said data buffering means, for storing said data written to and read from said semiconductor memory device;

a first signal generating means and a second signal generating means responsive to said row address strobe output signal, for generating a one shot pulse signal in synchronism with output of data from said data buffering means and for respectively outputting first and second noise suppressing signals therewith; and a digital logic means for suppressing noise produced on said column address strobe signal and said row address strobe signal output from said buffering means, said logic means responsive to said column and row address strobe signals, said first and second noise suppressing signals, and said address change detection signal.

* * * * *

UNITED STATES PATENT AND TRADEMARK OFFICE
CERTIFICATE OF CORRECTION

PATENT NO.:    5,440,511
DATED    :     August 8, 1995
INVENTOR(S):   Hiroshi Yamamoto, Kiyonori Ogura, Takashi Horii It is certified that error appears in the above-identified patent and that said Letters Patent is hereby corrected as shown below:

On the cover page, Item [73], the assignee's name --FUJITSU VLSI LIMITED, Kasugai-shi, Japan-- should proceed Fujitsu Limited, Kanagawa, Japan.

Signed and Sealed this

First Day of October, 1996

*Attest:*

BRUCE LEHMAN

*Attesting Officer*      *Commissioner of Patents and Trademarks*